(12) United States Patent
Takahashi et al.

(10) Patent No.: US 7,570,321 B2
(45) Date of Patent: Aug. 4, 2009

(54) LIQUID CRYSTAL DISPLAY DEVICE AND BACKLIGHT

(75) Inventors: Yoshiaki Takahashi, Chiba (JP);
Masahiko Kurihara, Togane (JP);
Masayuki Mifune, Mobara (JP); Ken Kagabu, Chosei (JP)

(73) Assignees: Hitachi Displays, Ltd., Chiba (JP); Hitachi Display Devices, Ltd., Chiba (JP)

( * ) Notice: Subject to any disclaimer, the term of this patent is extended or adjusted under 35 U.S.C. 154(b) by 465 days.

(21) Appl. No.: 11/481,862

(22) Filed: Jul. 7, 2006

(65) Prior Publication Data

US 2007/0008457 A1   Jan. 11, 2007

(30) Foreign Application Priority Data

Jul. 8, 2005   (JP)   ............................... 2005-200455

(51) Int. Cl.
*G02F 1/1335*   (2006.01)
*F21V 7/04*   (2006.01)

(52) U.S. Cl. ........................... 349/65; 349/58; 362/613; 362/631

(58) Field of Classification Search ......... 362/610–613, 362/631–634, 561; 349/65, 58
See application file for complete search history.

(56) References Cited

U.S. PATENT DOCUMENTS

| 7,173,677 | B2 * | 2/2007 | Kitamura et al. | 349/58 |
| 2003/0147257 | A1 * | 8/2003 | Lee | 362/561 |
| 2006/0239029 | A1 * | 10/2006 | Yu | 362/606 |
| 2007/0058396 | A1 * | 3/2007 | Xu et al. | 362/621 |

FOREIGN PATENT DOCUMENTS

| JP | 7-72815 | | 3/1995 |
| JP | 2004-6187 | | 1/2004 |
| JP | 2004177890 A | * | 6/2004 |
| JP | 2004-200072 | | 7/2004 |
| JP | 2004-227956 | | 8/2004 |

* cited by examiner

*Primary Examiner*—Hemang Sanghavi
(74) *Attorney, Agent, or Firm*—Antonelli, Terry, Stout & Kraus, LLP.

(57) ABSTRACT

A liquid crystal display device having includes a light guide plate having a surface thereof serving as an illuminating surface region opposite to a liquid crystal display panel, light sources mounted on a flexible printed-circuit board and provided on a side face of the light guide plate, an optical sheet member interposed between the liquid crystal display panel and the light guide plate. The side surfaces of the light guide plate with the light sources provided thereon have a ridge-like inclined surface formed thereon, when viewed from the illuminating surface, and the ridge-like inclined surfaces serve as a light-receiving surface with the light source arranged thereon.

16 Claims, 8 Drawing Sheets

LIQUID CRYSTAL DISPLAY DEVICE AND BACKLIGHT

CLAIM OF PRIORITY

The present application claims priority from Japanese Application JP 2005-200455 filed on Jul. 8, 2005, the content of which is hereby incorporated by reference into this application.

FIELD OF THE INVENTION

The present invention relates generally to liquid crystal display devices and backlight systems for the same. More specifically, the invention relates to a liquid crystal device that has an illuminating system suitably provided on a side face of a light guide plate with a point light source comprising a solid state light-emitting element such as a light-emitting diode as a luminous source for a liquid crystal display panel.

BACKGROUND OF THE INVENTION

A power-saving and light-weight liquid crystal display device is often used as a display device in a compact information terminal such as a mobile telephone or a PDA. Examples of liquid crystal display devices include those that make use of external light as a lighting means for visualizing a latent image formed on a liquid crystal display panel, and that have an auxiliary lighting system installed on a rear or front surface of the liquid crystal display panel. An auxiliary lighting system provided on a rear surface of the liquid crystal display panel is sometimes referred to as a backlight system, while that provided on a rear surface is generally referred to as a front-lighting system.

Examples of a backlight system for a compact information terminal such as a mobile telephone include one having a light guide plate having a cathode luminescent lamp provided on a side face (a side edge, or a light-receiving surface) as used in a laptop personal computer with a relatively large-sized display screen. However, a backlight system that uses, in place of a cathode luminescent lamp, one or a plurality of light point sources which are solid light-emitting elements represented by light-emitting diodes is suitable for a compact information terminal. Herein, the backlight system is described by taking a light-emitting diode as an example of the solid light-emitting element.

There is a backlight system of a type in which a plurality of light-emitting diodes (each referred to as LED hereinafter) are provided as light sources, light emitted from the LED is introduced onto a side face (light-receiving surface) of the light guide plate and goes out from an illuminating surface which is a top surface of the light guide plate and functions as a surface light source. This backlight system has a large difference in brightness between the forward LEDS of the LEDs within the light guide plate. There have been proposed various ideas to reduce a difference in brightness between the LEDs when a plurality of LEDs are used, but there is still no complete countermeasures to overcome the problem.

In relation to the backlight system as described above, an idea of eliminating unevenness in brightness by improving a form of a groove provided on the light guide plate has been proposed by, for instance, Patent documents 1: Japanese Patent Laid-open No. 2004-200072, Patent document 2: Japanese Patent Laid-open No. 2004-6187, Patent document 3: Japanese Patent Laid-open No. 2004-227956 and Patent document 4: Japanese Patent Laid-open No. 7-72815.

SUMMARY OF THE INVENTION

Also the backlight system using LEDS as light sources is required to reduce costs. One of effective means for meeting the requirement is conceived to reduce the number of LEDs. When the number of LEDs is reduced, however, a space between the LEDs arranged opposite to a light-receiving surface of the light guide plate becomes larger, which leads to lowering in brightness of LEDs on the light-receiving surface of the light guide plate due to the effect of the widening space. This generates brightness variations on the illuminating surface, with the result that the display quality disadvantageously becomes lower.

For instance, in the conventional technology disclosed in Patent document 4, a plurality of so-called shell-shaped LEDs are provided on a side face functioning as a light-receiving surface of the light guide plate, and an outgoing light axis of each of LEDs arranged at edge portions is more inclined as compared to that of each of those arranged in the central portion. The shell-shaped LEDs are held by a holder and buried in the light-receiving surface of the light guide plate.

However, recently the so-called surface-mounted type of LEDs have been more and more used in place of the shell-shaped LEDs based on the conventional technology. The conventional technology does not take into account the holding structure most suitable for use of the surface-mounted type of LEDs.

An object of the present invention is to provide a liquid crystal display device capable of preventing degradation of display quality, when a minimum number of LEDs are provided on the light-receiving surface of the light guide plate, by suppressing in-plane brightness variations on the illuminating surface due to brightness-lowering among the LEDs. More specifically, an object of the present invention is to provide a backlight system (lighting system) capable of preventing the illuminating surface from being locally darkened due to lowering of brightness of LEDs and also capable of preventing generation of brightness variations even when the number of LEDs is reduced to reduce cost of a backlight system using the surface-mounted types of LEDs, and also to provide a liquid crystal display device using the lighting system.

A general configuration of the present invention is as described below. (1) When a plurality of LEDs are provided at respective positions opposite to the light-receiving surfaces of a light guide plate, the LEDs provided at both edge portions of the light guide plate are each arranged to incline with respect to a normal to a central axis of the illuminating surface region (a surface opposite to the liquid crystal display panel). (2) A positioning pin is provided at least at a position on the light guide plate, and a hole for a flexible printed-circuit board (FPC) with the LED mounted thereon is provided in the FPC so as to be fittably engaged with the positioning pin. (3) A sheet positioning hole engaged with the positioning pin is provided also in a portion of an optical protection sheet such as a diffusion sheet or a prism sheet. (4) Reflection grooves are provided on the surface of the light guide plate opposite with the illuminating surface region. A representative configurational example of the present invention is as described below.

The liquid crystal display device according to the present invention includes a liquid crystal display panel, and a backlight system (backlight) provided on the rear surface of the liquid crystal display panel. The backlight system includes an light guide plate formed of a transparent and thin plate with the surface opposite to the liquid crystal display panel functioning as an illuminating surface, point light sources mounted on a flexible printed-circuit board and provided on side surfaces of the light guide plate, and an optical sheet or like provided between the point light source and the liquid crystal display panel.

The side surfaces of the light guide plate, on which the point light sources are provided, form ridge-like inclined surfaces when viewed from the illuminating surface region, and for instance, LEDs are provided as point light sources on the inclined surfaces respectively.

There is provided at least one positioning pin projecting toward a surface parallel to the illuminating surface region along on the sides of the light guide plate where the ridge-like inclined surfaces are formed.

The flexible printed-circuit board has a flexible printed-circuit board positioning hole with which the positioning pin formed on the light guide plate is engaged.

Since the positioning pin provided on the light guide plate is engaged with the flexible printed-circuit board positioning hole on the flexible printed-circuit board, the point light source is positioned at a predetermined position relative to the ridge-like inclined surfaces functioning as light-receiving surfaces of the light guide plate.

Reflection grooves are provided on a surface opposite with the illuminating surface of the light guide plate. The reflection grooves are formed (1) parallel to one of the inclined surfaces functioning as light-receiving surfaces, (2) parallel to each of the inclined surfaces functioning as light-receiving surfaces, or (3) parallel to a short side opposite to the other short side forming the light-receiving surfaces.

The optical sheets include two prism sheets held between upper and lower diffusion sheets, and some of the optical sheets each have a sheet positioning hole with which the positioning pin on the light guide plate is engaged. In addition, reflection grooves are provided on a surface opposite with the illuminating surface of the light guide plate.

With the present invention, when a minimum number of LEDs are provided on the light-receiving surfaces of the light guide plate, generation of brightness variations on the illuminating surface due to lowering of brightness of the LEDs is suppressed, which prevents degradation in display quality. With the present invention, cost of the backlight system using the surface-mounted type of LEDs can be reduced, and even when the number of LEDs is reduced, it never occurs that brightness of the LEDs lowers to locally darken the illuminating surface and that brightness variations are generated.

DETAILED DESCRIPTION OF THE PREFERRED EMBODIMENTS

Preferred embodiments of the present invention will be described in detail below with reference to the drawings.

First Embodiment

Figure 1:
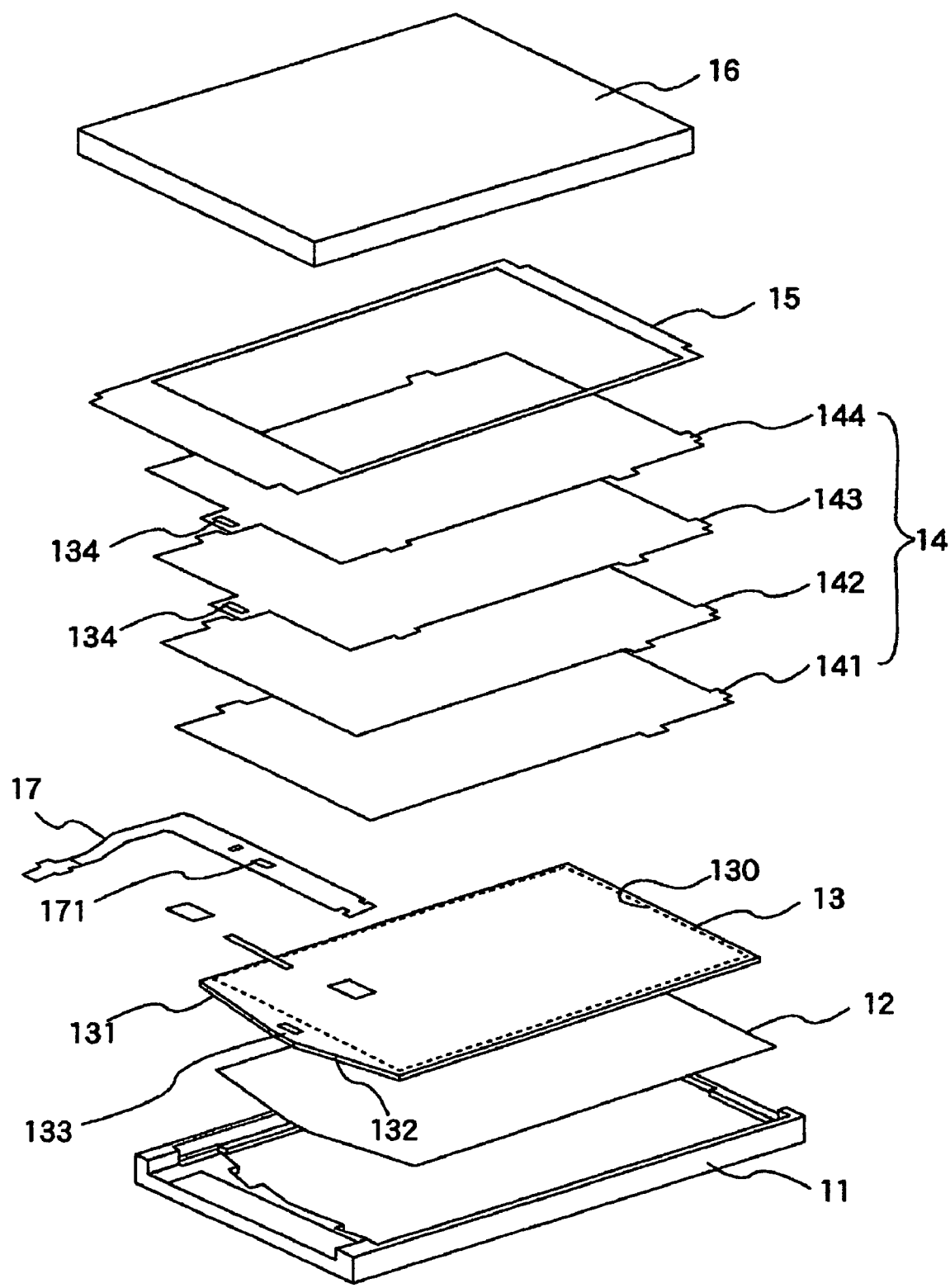
FIG. 1 is a perspective view showing a general configuration of a liquid crystal display device according to a first embodiment of the present invention.

FIG. 1 is a developed perspective view illustrating the general configuration of a liquid crystal display device according to a first embodiment of the present invention. This liquid crystal display device includes a lower frame 11 made of resin or metal, and a reflecting sheet 12 and a light guide plate 13 provided on the lower frame 11. The device further includes an optical sheets 14 including a plurality of components such as a lower diffusing sheet 141, a lower prism sheet 142, an upper prism sheet 143, and an upper diffusing sheet 144 provided on the light guide plate 13. Furthermore, the device includes a lightproof double-faces tape 15 and a liquid crystal display panel (also referred to as LCD panel) 16 provided on the plurality of optical sheets. An upper frame 11 used to unite the members mentioned above and the lower frame 11 is not shown.

In this embodiment, the light guide plate 13 has light-receiving surfaces 131, 132, and a surface facing the optical sheets 14 defined as a illuminating surface region. This illuminating surface region functions as a surface light source lighting the liquid crystal display panel 16 from the rear surface thereof. Furthermore, the light-receiving surfaces 131, 132 adapted to introduce light from the light source form a ridge-like surface having a vertex when viewed from the illuminating surface region. In addition, one LED as a point light source is provided on each of the inclined faces of the ridge-like surface. The two LEDs are inclined outward at a predetermined angle $\theta$ relative to a normal to a center line (in parallel to a long side of the light guide plate), described below with reference to FIG. 3, of the illuminating surface region 130 for the backlight system described below.

A positioning pin 133 is formed to project toward a surface parallel to the illuminating surface contiguous to the sides forming the ridge-like inclined surface of the light guide plate 13 mentioned above. When the positioning pin 133 is engaged with a positional hole (an FPC positioning hole) 171 of a flexible printed-circuit board (FPC) 17 with an LED mounted thereon, the respective LEDs are precisely disposed on the light-receiving surfaces 131 and 132. Furthermore, the positioning pin 133 is engaged with each of respective sheet positioning holes 134 formed in an upper prism sheet 143 and a lower prism sheet 144, so that the optical sheets 14 are positioned at prespecified positions.

Figure 2:
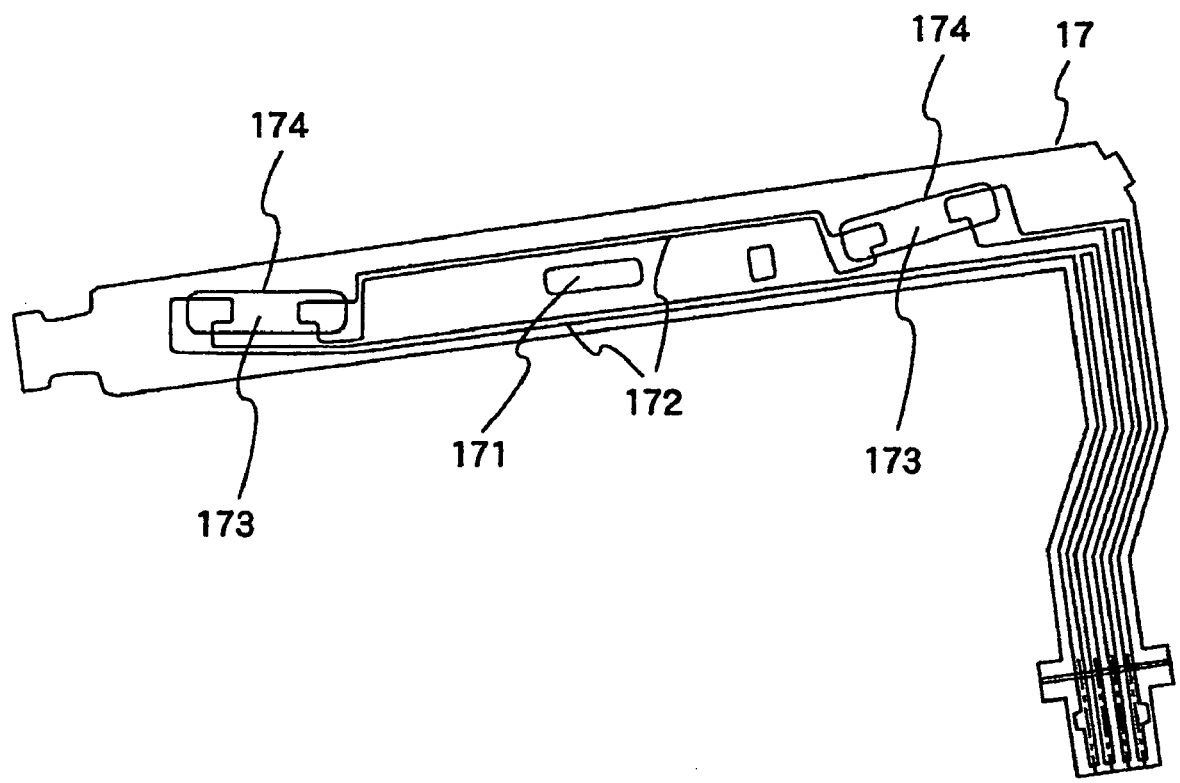
FIG. 2 is a flat view illustrating a general configuration of a flexible printed-circuit board with an LED packaged thereon in the liquid crystal display device according to the first embodiment of the present invention.

FIG. 2 is a plan view illustrating the configuration of a flexible printed-circuit board with an LED mounted thereon used in the liquid crystal display device according to the first embodiment of the present invention. In this embodiment, the LEDs are each disposed at an angle relative to a normal to the central axis parallel to the long side of the illuminating surface region of the light guide plate 13. Accordingly, an opening 174 (LED opening) in an LED-mounted portion 173 of the FPC 17 follows the LED-mounting structure. That is, it is disposed at a position inclined relative to a normal to the central axis parallel to the long side of the illuminating surface region of the light guide plate 13.

Arrangement of the LED is restricted by the form of the LED opening 174, and as a result, the LED is inclined outward at a predetermined angle θ relative to a normal to the central axis parallel to the long side of the illuminating surface region of the light guide plate 13. A wiring pattern 172 for driving the LED is formed on the FPC 17, and also a terminal portion of the wiring pattern 172 is formed to have a large width in the LED opening 174. The wiring patterns 172 extend along both sides of the FPC positioning hole 171 so that the two LEDs mounted in the LED openings 173 may be maintained at symmetrical positions with respect to the FPC positioning hole 171.

Referring again to FIG. 1, in this embodiment, the LEDs are inclined at a predetermine angle relative to a normal line to the central axis parallel to the long side of the illuminating surface region of the light guide plate 13 as described above, and furthermore the light-receiving surfaces 131, 132 of the light guide plate 13 are opposite to the inclined LEDs.

FIGS. 3A and 3B are explanatory views illustrating a light guide plate constituting a lighting system in the liquid crystal display device according to the first embodiment of the present invention. FIG. 3A is a plan view of the light guide plate as viewed from the side of the liquid crystal display device, while FIG. 3B is a side view thereof. The positional relationship between the light guide plate 13 and the LEDs in this embodiment is described below with reference to FIGS. 3A and 3B. The light guide plate 13 is formed of a transparent thin plate which is preferably an acrylic plate, and has a substantially rectangular form when viewed from the top. The surface (rear surface) of the liquid guide plate 13 away from the liquid crystal display panel is subjected to a reflection process 135.

The illuminating surface region 130 is provided on the surface opposite the liquid crystal display panel. The form of the illuminating surface region 130 corresponds to that of a display region of the liquid crystal display panel. The light-receiving surfaces 131, 132 of the light guide plate 13 meet each other at a position outside the illuminating surface region 130 and on the central axis C parallel to the long sides of the illuminating surface region 130 so as to form an abutment angle, so that the entire light guide plate 13 is formed to be pentagonal. At the abutment angle portion, the positioning pin 133 is provided to project toward a plane parallel to the illuminating surface 130, from the light-receiving surfaces 131, 132, which are sides where the angled-slant surface of the light guide plate 130 is formed.

The light-receiving surfaces 131, 132 of the light guide plate 13 are symmetrically inclined relative to the central axis C of the illuminating surface region 130 at the predetermined angle θ relative to a normal to the central axis C parallel to the long sides of the illuminating surface region 130. An LED 151 (a first LED) and an LED 152 (a second LED) are arranged as point light sources on the light-receiving surfaces 131, 132, respectively.

In this embodiment, when the size of the light guide plate 13 is 32 mm×38 mm and an inclination θ of each of the light-receiving surfaces 131, 132 is 10 degrees, the first LED 151 and the second LED 152 are positioned such that the distance d between each of the first LED 151 and the second LED 152 and an edge of the illuminating surface region 130 of the light guide plate 13 is in the range from 6 to 10 mm. The reasons for the distance d set in this range are (1) to prevent brightness between the LED 151 and the LED 152 from becoming lower, and also (2) to prevent brightness at corners of the illuminating surface region near the light-receiving surfaces 131, 132 from becoming lower.

As shown in FIGS. 3A and 3B, the first and second LEDs 151 and 152 are positioned such that an extension line L1 of a normal from the first LED 151 to the light-receiving surface 131 and an extension line L2 of a normal from the second LED 152 to the light-receiving surface 132 cross each other at a position O on the central axis C of the illuminating surface region 130. This cross point O is set at a position opposite to the light-receiving surfaces 131, 132 with respect to the center S of the illuminating surface region 130 as indicated by arrow A.

This configuration is employed (1) to ensure an excellent surface light surface within the illuminating surface region 130, and also (2) to improve the efficiency in use of introduced light.

Another feature of the present embodiment is that the positioning pin 133 is disposed on the central axis C of the illuminating surface region 130 on the side of the light-receiving surfaces 131, 132. This configuration is described below.

With the configuration in this embodiment, when the positions of the LEDs and the form of the light guide plate are taken into consideration, it is possible to provide a structure advantageous to position the FPC 17 with the LED mounted thereon and the optical sheets 14. In this embodiment, the light guide plate 13, the FPC boards 17 with the LEDs 151, 152 mounted thereon, and the optical sheets 14 are positioned as shown in FIG. 1. That is, the positioning pin 133 is formed on the light guide plate 13 itself so that the light guide plate 13, the FPC boards 17 with the LEDs 151, 152 mounted thereon, and the optical sheets 14 can be positioned as shown in FIG. 1.

This positioning pin 133 may be formed as a projection, for instance, simultaneously when the light guide plate 13 is manufactured by means of injection molding. Alternatively, the positing pin may separately be formed with a material different from or with the same material as that of the light guide plate 13. The form of this positioning pin 133 is not restricted to the form shown in the figure, and may be any geometrical form including forms such as a cylinder, an elliptic cylinder, a triangular pole, and a square pole.

Figure 3:
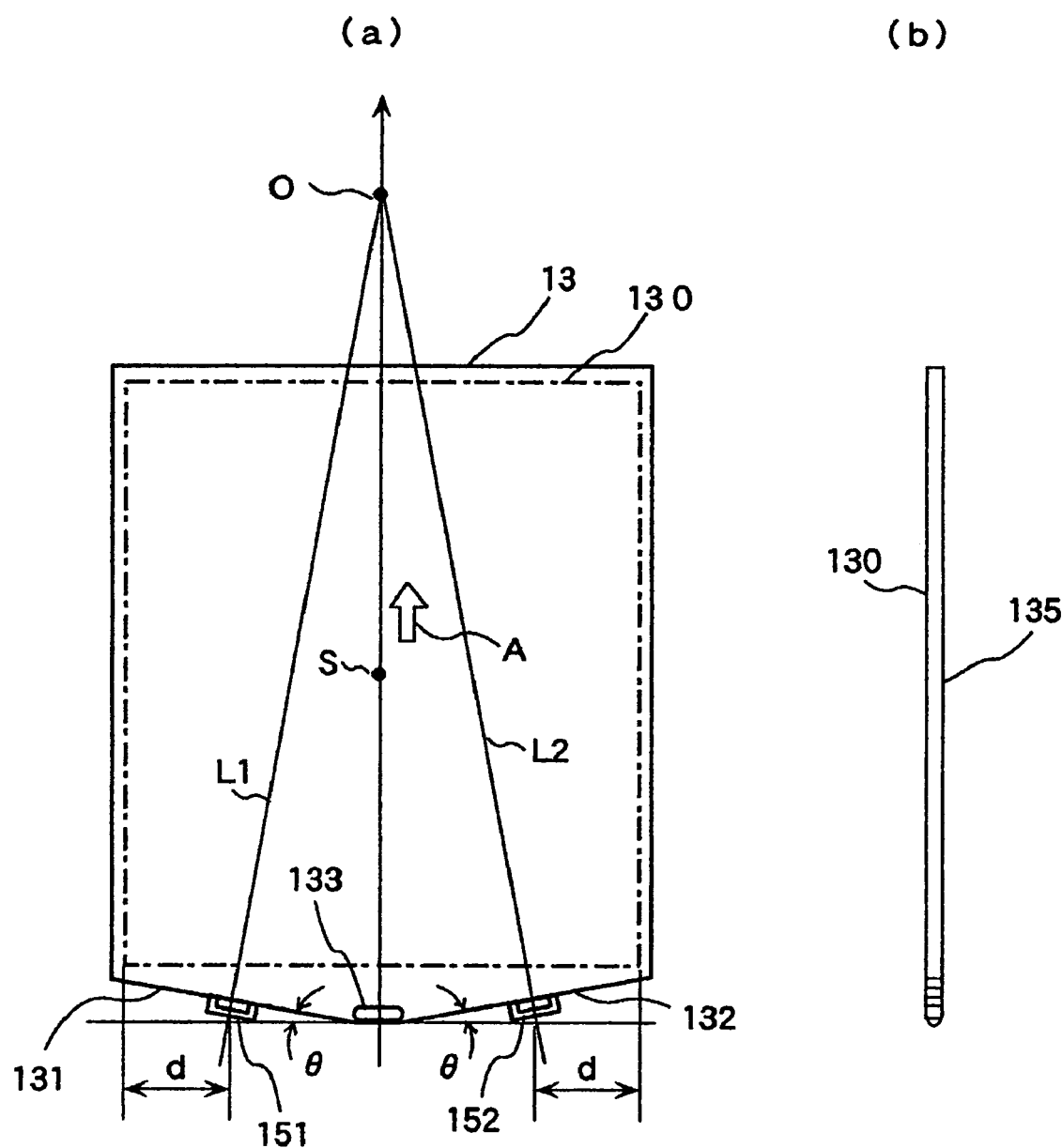
FIGS. 3A and 3B illustrate a light guide plate constituting a lighting system in the liquid crystal display device according to the first embodiment of the present invention.

In this embodiment, as shown in FIG. 3, since a ridge-like form having the inclined light-receiving surfaces 131, 132 is provided in the light guide plate 13, it is needed only to form the positioning pin 133 at only one position, and the positioning pin 133 can be formed on the light guide plate 13 as a single-piece therewith or as a separate body therefrom.

In the conventional technology, the FPC positioning pin is provided between LEDs on a light guide plate, or at two edge portions of the light guide plate outside the outermost LEDs, or at two or three positions on a molded frame which is a lower frame. However, because the light-receiving surfaces of the light guide plate are parallel to the illuminating surface region and the LEDs are provided on the light-receiving surfaces, in-plane brightness variations on the illuminating surface region disadvantageously occurs due to positional displacement of the LEDs in a direction along the light-receiving surface.

The positioning pin for the light guide plate or for the molded frame is formed by molding with a die, while the positioning hole for the FPC board is formed by punching. Accordingly, the manufacturing precisions in the two techniques are different from each other, resulting in a limit in high precision positioning. In this embodiment, the light-receiving surfaces, on which LEDs are placed respectively, are inclined to provide a form like a rafter roof, and therefore there is no positional displacement of the LEDs arranged on the light-receiving surfaces with respect to the central axis. Furthermore, displacement of the LEDs in a direction perpendicular to the illuminating surface region can be suppressed by providing the positioning pin only at one position.

As shown in FIG. 1, the positioning pin 133 is arranged on the light guide plate 13 so as to pass through the FPC positioning holes 171 formed on the FPC boards 17 with the LED 151, 152 mounted thereon respectively and the respective sheet positioning holes 134 in a upper prism sheet 143 and an upper diffusing sheet 144, which are included in the optical sheets 14.

Of the optical sheets 14, only the upper prism sheet 143 and the upper diffusing sheets 144 each have a positioning hole provided thereon, and a lower diffusing sheet 141 and a prism sheet 142 each do not have the positioning hole. This is because of the following: The thickness of the FPC board 17 is substantially equal to a total thickness of the lower diffusing sheet 141 and the lower prism sheet 142. When positioning holes are provided also on these two sheets, a step is generated between the sheets and the illuminating surface region since the two sheets are overlaid on the FPC boards 17. In this case, adhesion between the lightproof double-faces tape 15 and the liquid crystal display panel 16 is disadvantageously inadequate. The lightproof double-face tape 15 covers the illuminating surface region above the optical sheets 14 to prevent leakage of light and also has a function of tightly fixing the optical sheets 14 to the liquid crystal display panel 16.

Figure 4:
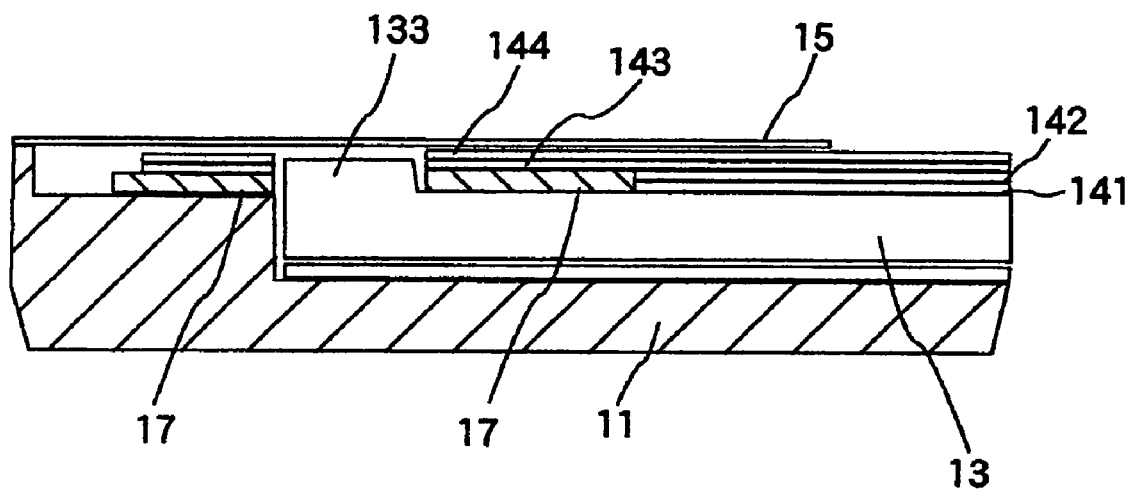
FIG. 4 is a cross-sectional view of a key section, taken along a center line of an illuminating surface, illustrating the relationship among a positioning pin for the light guide plate, an flexible printed-circuit board, and an optical sheets in the first embodiment of the present invention.

FIG. 4 is a key-section cross-sectional view taken along the center line of the illuminating surface, illustrating the positional relationship between the positioning pin on the light guide plate and, FPC boards and optical sheets according to the first embodiment of the present embodiment. As shown in FIG. 4, the FPC board 17, the upper diffusing sheet 144, and the upper prism sheet 143 are held by the protruding positioning pin 133 formed on the light guide plate 13 at a predetermined position. The lower diffusing sheet 141 and the lower prism sheet 142 are held at the predetermined position by being abutted at its edges against the FPC boards 17. Forms of grooves provided on the light guide plate 13 according to the present invention are described below.

Figure 5:
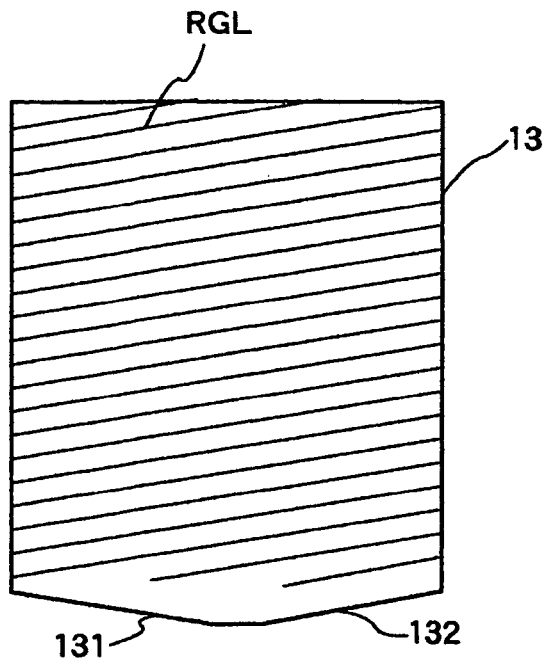
FIG. 5 is a plan view illustrating a first example of reflection grooves formed on the reflection surface of a light guide plate away from a liquid crystal display panel.

FIG. 5 is a plan view illustrating a first example of reflection grooves formed on the reflection surface of the light guide plate away from the liquid crystal display panel. In the first example, the reflection grooves are formed on the light guide plate 13 in parallel to the light-receiving surface 132 to provide a pattern RGL. The light-receiving surface 131 is a side face of the light guide plate 13 on which a first LED 151 is mounted, and the light-receiving surface 132 is a side face of the light guide plate 133 on which a second LED 152 is mounted. In this embodiment, a top surface of the light guide plate 13 (the surface, facing the liquid crystal display panel, on which the positioning pin 133 is formed) is defined as a light-outgoing surface, namely an illuminating surface region, and the bottom surface opposite with the surface facing the illuminating surface region as a reflecting surface, and the grooves formed on the reflecting surface are referred to as reflection grooves.

Grooves perpendicular to the reflection grooves may be, or may not be provided on the surface of the illuminating surface region. In this embodiment, the reflection grooves are formed on the bottom surface (a rear surface on which the reflecting sheet 12 is placed) of the light guide plate 13, but the reflection grooves may be formed on the top surface of the light guide plate 13.

Figure 6:
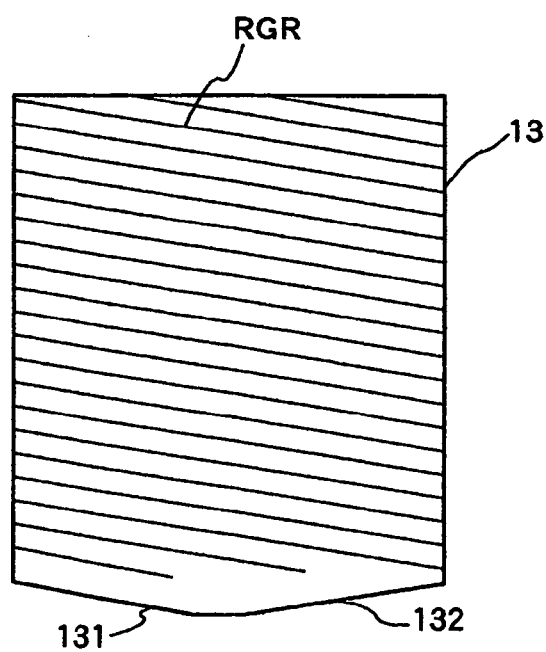
FIG. 6 is a plan view illustrating a second example of reflection grooves formed on the reflection surface of the light guide plate away from the liquid crystal display panel.

FIG. 6 is a plan view illustrating a second example of reflection grooves formed on the reflection surface of the light guide plate away from the liquid crystal display panel. In the second example, reflection grooves are formed on the light guide plate 13 in parallel to the light-receiving surface 131 to provide a pattern RGR.

As shown in FIGS. 5 and 6, since the reflection grooves are arranged on the light guide plate 13 in parallel to either one of the light-receiving surfaces, light from one of the LEDs can efficiently be guided by the reflection grooves toward the liquid crystal display panel, and light from the other LED diffuses along the reflection grooves, thereby suppressing variations in brightness of the back light.

Figure 7:
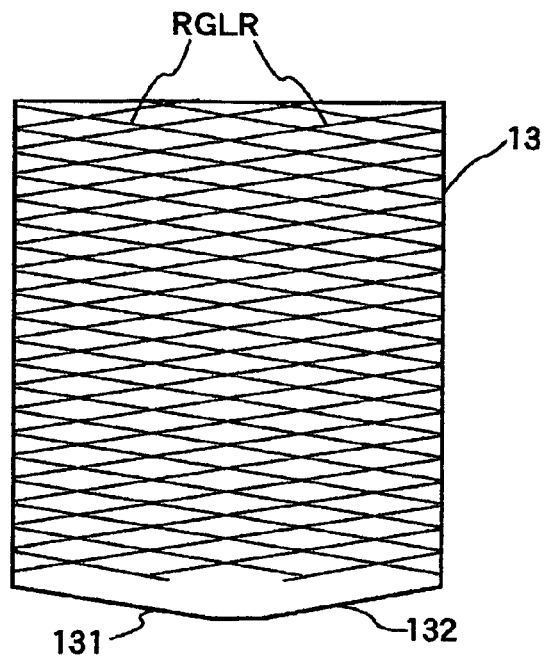
FIG. 7 is a plan view illustrating a third example of reflection grooves formed on the reflection surface of the light guide plate away from the liquid crystal display panel.

FIG. 7 is a plan view illustrating a third example of reflection grooves formed on the reflection surface of the light guide plate away from the liquid crystal display panel. In this third example, reflection grooves RGLR are formed on the light guide plate 13 in parallel to the light-receiving surface 131 and 132 to provide a cross pattern RGLR. In this configuration, light from the two LEDs can most efficiently be taken out and guided toward the liquid crystal display panel, and therefore this configuration is effective in improving brightness of backlight.

Figure 8:
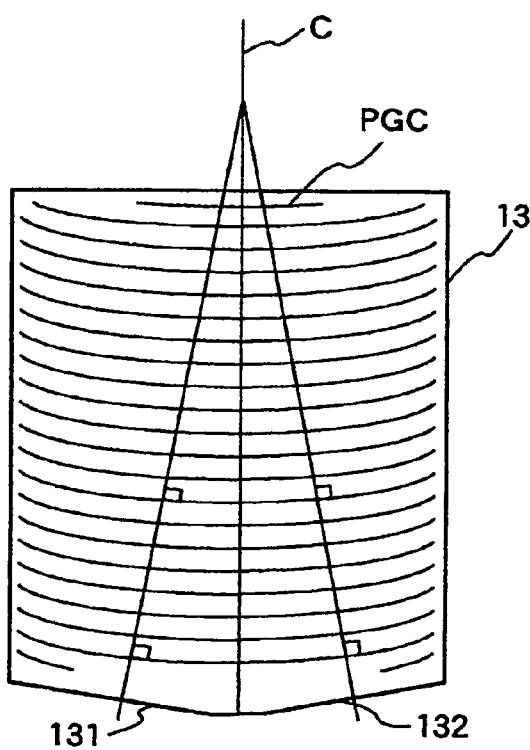
FIG. 8 is a plan view illustrating a fourth example of reflection grooves formed on the reflection surface of the light guide plate away from the liquid crystal display panel.

FIG. 8 is a plan view illustrating a fourth example of reflection grooves formed on the reflection surface of the light guide plate away from the liquid crystal display panel. In this fourth example, reflection grooves are provided on the light guide plate 13 according to a curbed pattern RGC concaved like a dome toward the inner side of the illuminating surface region and also toward the light-receiving surfaces. In this configuration, a correcting pattern corresponding to inclinations of the LED shown in FIG. 7 is the cross pattern RGLR. Functionally synthesizing the cross pattern provides a pattern equivalent to the curved grooves shown in FIG. 8.

Figure 9:
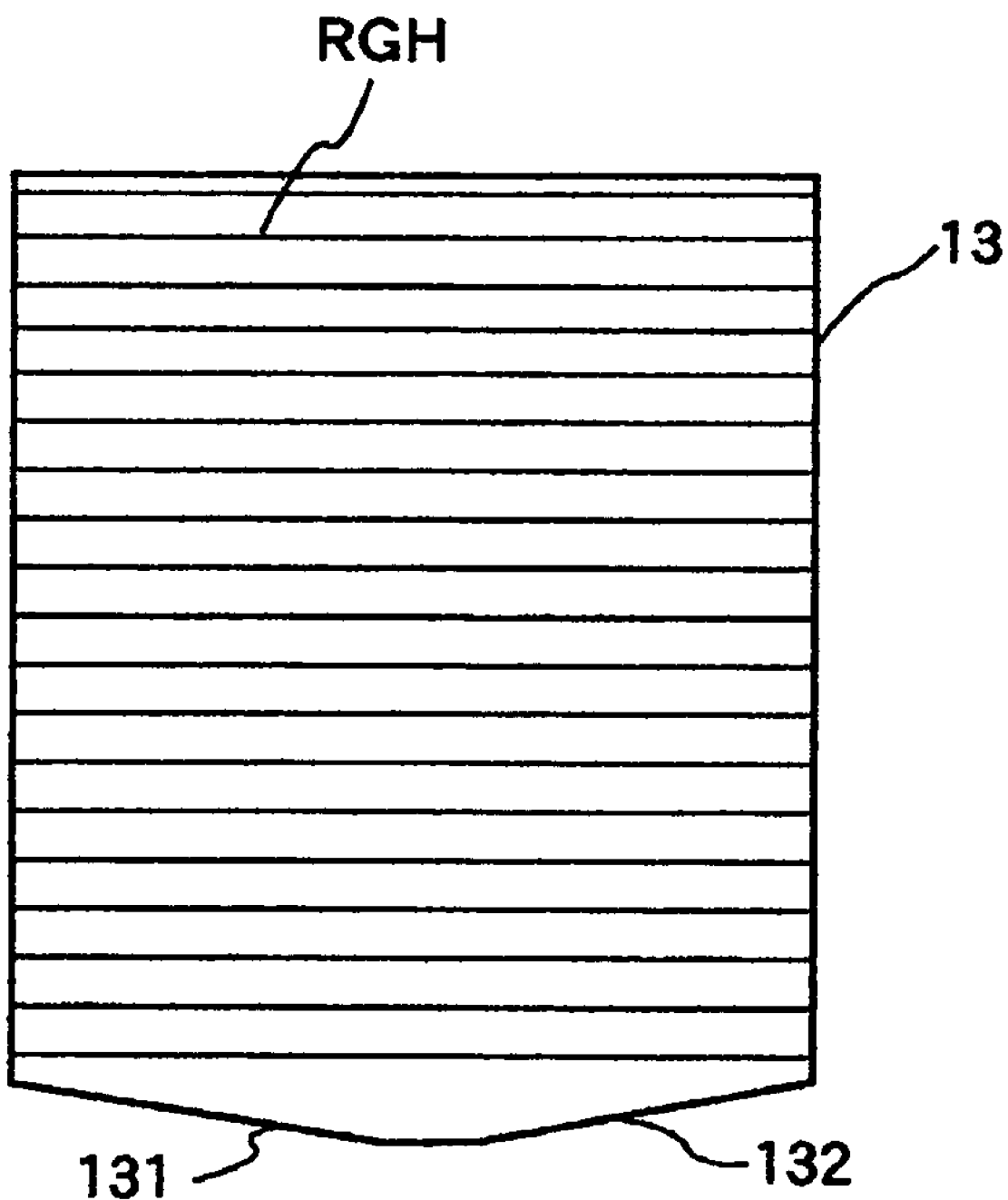
FIG. 9 is a plan view illustrating a fifth example of reflection grooves formed on the reflection surface of the light guide plate away from the liquid crystal display panel.

FIG. 9 is a plan view illustrating a fifth example of reflection grooves formed on the reflection surface of the light guide plate away from the liquid crystal display panel. In the fifth example, the reflection grooves are formed on the light guide plate 13 in parallel to a short side of the light guide plate 13 opposite to the short sides formed with the light-receiving surfaces 131, 132 to provide a pattern RGH. In this configuration, the reflection groove pattern RGH is not correctly opposite to the light-inducing axis of each LED, and therefore the light-use efficiency is slightly inferior to that in the other embodiments. However, the workability and reproducibility of each reflection groove is superior to that in the other embodiments. Because of the feature, the configuration according to the fifth embodiment is most adapted to mass production.

Figure 10:
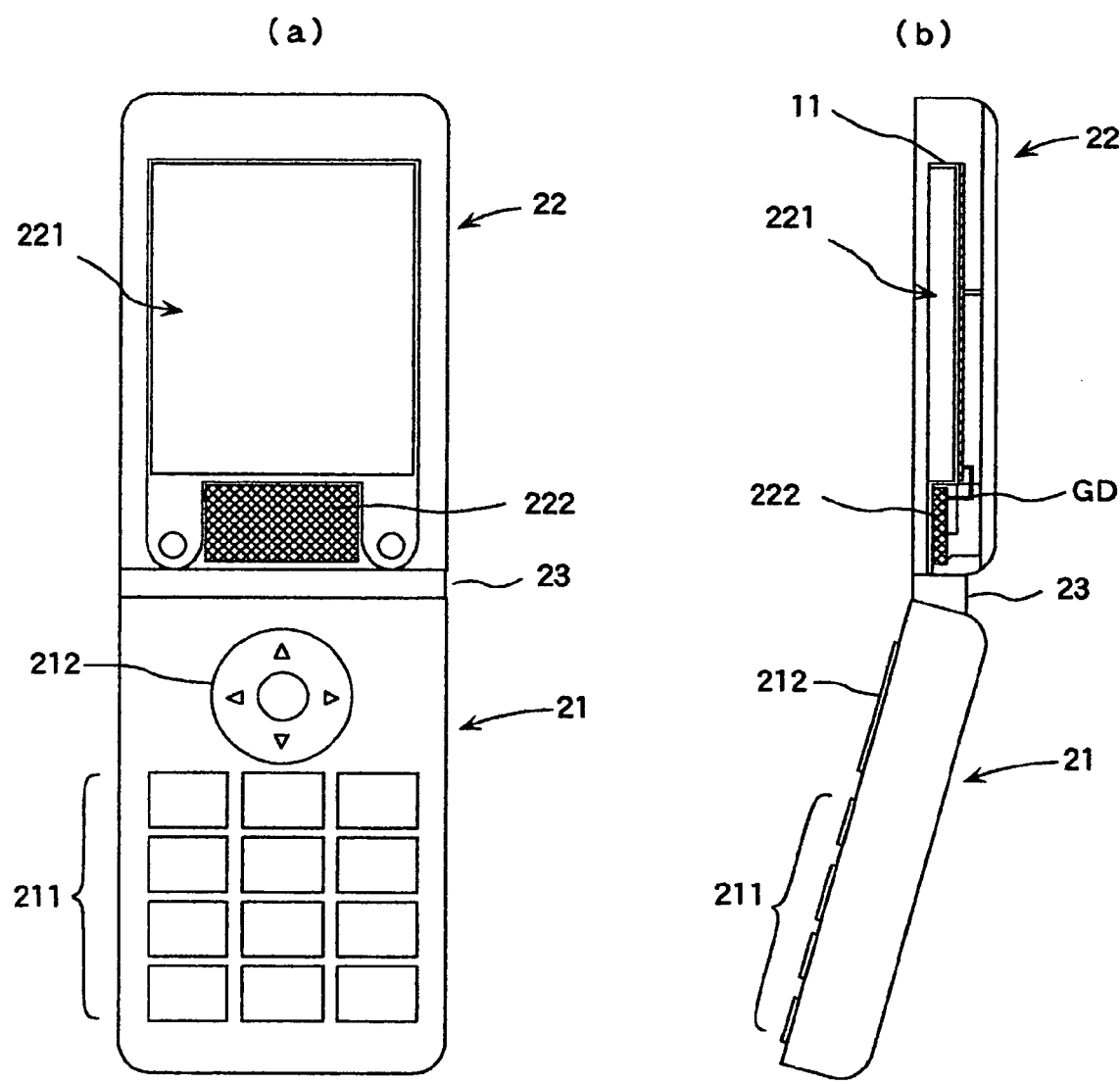
FIG. 10 is a general block diagram of a mobile telephone terminal in which the liquid crystal display device according to the present invention is applied.

FIGS. 10A and 10B are schematics of a mobile telephone terminal in which the liquid crystal display device according to the present invention is applied. FIG. 10A is a front view illustrating a display section with its surface casing removed, while FIG. 10B is a side view transparently illustrating a key section of the display section. In this mobile telephone terminal, a main body section 21 and a display section 22 are foldably jointed to each other with a hinge 23.

A data processing circuit including a CPU and other components are accommodated in the main body section 21, and an operation key 211 and function control buttons 212 are provided on the surface. A liquid crystal display device is packaged in the display section 22. This liquid crystal display device includes the light guide plate and an optical compensating sheet provided in a lower casing 11, a liquid crystal display panel 221, and a driving circuit section 222. The light guide plate has the configuration according to any of the embodiments described above.

A configuration of the present invention is not limited to those in the embodiments described above. Furthermore, The number of light-receiving surfaces provided on the light guide plate is not limited to two, and forms having three or more ridges may be employed in the present invention. By providing the reflection grooves described above to each of the light-receiving surfaces, it is possible to provide a liquid crystal display device capable of eliminating brightness variations in the illuminating surface region.

What is claimed is:

1. A liquid crystal display device having a liquid crystal display panel and a backlight system provided on a rear side of said liquid crystal display panel, said backlight system comprising:
   a light guide plate having a surface thereof serving as a illuminating surface region opposite to the liquid crystal display panel;
   light sources each mounted on a flexible printed-circuit board and provided on a side face of said light guide plate; and
   an optical sheet member interposed between said liquid crystal display panel and said light guide plate;
   wherein the side surfaces of said light guide plate with the light sources provided thereon have a ridge-like inclined surface formed thereon when viewed from the illuminating surface and each of said ridge-like inclined surfaces serves as a light-receiving surface with said light source arranged thereon; and
   wherein said light guide plate has a positioning pin formed to project toward a face parallel to the illuminating surface region and said flexible printed circuit has a flexible printed circuit positioning hole engaging with said positioning pin formed on said light guide plate.

2. The liquid crystal display device according to claim 1, wherein said flexible printed circuit positioning hole of said flexible printed circuit is engaged with said positioning pin of said light guide plate so that said light sources are positioned at respective predetermined positions relative to said ridge-like inclined surfaces serving each as a light-receiving surface of said light guide plate.

3. The liquid crystal display device according to claim 1, wherein said positioning pin is formed in the vicinity of a vertex of said ridge-like inclined surfaces.

4. The liquid crystal display device according to claim 1, wherein said optical sheet member includes a prism sheet.

5. The liquid crystal display device according to claim 1, wherein said optical sheet member includes a diffusion sheet.

6. The liquid crystal display device according to claim 1, wherein said optical sheet member comprises two prism sheets held between upper and lower diffusion sheets.

7. The liquid crystal display device according to claim 6, wherein any one of said prism sheet and said diffusion sheet constituting said optical sheet member has a sheet positioning hole engaging with said positioning pin on said light guide plate.

8. The liquid crystal display device according to claim 6, wherein any one of said prism sheet and said diffusion sheet constituting said optical sheet member has a sheet positioning hole engaging with said positioning pin on said light guide plate.

9. The liquid crystal display device according to claim 1, wherein said light source is a point light source.

10. The liquid crystal display device according to claim 1, wherein said light source is a light-emitting diode.

11. The liquid crystal display device according to claim 1, wherein said ridge-like inclined surfaces are formed on a short side of said light guide plate.

12. The liquid crystal display device according to claim 1, wherein, when the length of one of said ridge-like inclined surfaces is defined as L, one of said light sources arranged in one of said ridge-like inclined surfaces is located within 12.5% of L from a central position of one of said ridge-like inclined surfaces.

13. The liquid crystal display device according to claim 1, wherein, when the normal lines are drawn from the positions, at which said light sources of said ridge-like inclined surfaces are arranged, to said ridge-like inclined surfaces, an intersection of said two normal lines is located on a side opposite to the side on which said ridge-like inclined surfaces are formed.

14. A backlight system used in a liquid crystal display panel, comprising:
   a light guide plate having a surface thereof serving as a illuminating surface region opposite to the liquid crystal display panel;
   light sources each mounted on a flexible printed-circuit board and provided on a side face of said light guide plate; and
   an optical sheet member interposed between said liquid crystal display panel and said light guide plate;
   wherein the side surfaces of said light guide plate with the light sources provided thereon have a ridge-like inclined surface formed thereon when viewed from the illuminating surface and each of said ridge-like inclined surfaces serves as a light-receiving surface with said light source arranged thereon; and
      wherein said light guide plate has a positioning pin formed to project toward a face parallel to the illuminating surface region and said flexible printed circuit has a flexible printed circuit positioning hole engaging with said positioning pin formed on said light guide plate.

15. The backlight system according to claim 14, wherein said flexible printed circuit positioning hole in said flexible printed circuit is engaged with said positioning pin of said light guide plate so that said light sources are positioned at respective predetermined positions on said ridge-like inclined surfaces serving as light-receiving surface of said light guide plate.

16. The backlight system according to claim 14, wherein said positioning pin is formed in the vicinity of the top portion of said ridge-like inclined surfaces.

* * * * *